US008698555B2

(12) United States Patent
Fang et al.

(10) Patent No.: US 8,698,555 B2
(45) Date of Patent: Apr. 15, 2014

(54) LOW DISTORTION VARIABLE GAIN AMPLIFIER (VGA)

(75) Inventors: Steve Fang, Sunnyvale, CA (US); Qiang Tang, Cupertino, CA (US); Myung Jae Yoo, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 10 days.

(21) Appl. No.: 13/291,782

(22) Filed: Nov. 8, 2011

(65) Prior Publication Data

US 2012/0126889 A1    May 24, 2012

Related U.S. Application Data

(60) Provisional application No. 61/415,767, filed on Nov. 19, 2010.

(51) Int. Cl.
*H03F 1/02*     (2006.01)
*G11B 5/09*     (2006.01)

(52) U.S. Cl.
USPC .................................................. 330/9; 360/46

(58) Field of Classification Search
USPC ....................................... 330/9; 360/46, 67, 68
See application file for complete search history.

(56) References Cited

U.S. PATENT DOCUMENTS 7,092,180 B2 *  8/2006  Franck ............................ 360/46
7,737,775 B2 *  6/2010  Lo et al. ........................... 330/9

* cited by examiner

*Primary Examiner* — Steven J Mottola

(57) ABSTRACT

In one embodiment, an apparatus an amplifier configured to receive an asymmetric signal. A first resistance is coupled between an input node and an output node of the amplifier, the input node receiving the asymmetric signal. A second resistance is coupled to the input node of the amplifier. The second resistance includes a linear resistor. A third resistance is coupled to the second resistance. The third resistance is varied to adjust an amount of asymmetric correction provided by the amplifier to correct the asymmetric signal at the output node. The amount of asymmetric correction is a function of the first resistance and a combination of the second resistance and the third resistance.

26 Claims, 6 Drawing Sheets

LOW DISTORTION VARIABLE GAIN AMPLIFIER (VGA)

CROSS REFERENCE TO RELATED APPLICATIONS

The present disclosure claims priority to U.S. Provisional App. No. 61/415,767 for "Low Distortion VGA+MR" filed Nov. 19, 2010, which is incorporated herein by reference in its entirety for all purposes.

BACKGROUND

Particular embodiments generally relate to amplifiers.

Unless otherwise indicated herein, the approaches described in this section are not prior art to the claims in this application and are not admitted to be prior art by inclusion in this section.

In a read channel for a hard disk drive, a signal received from a read head of the disk drive may be asymmetric. For better performance, the symmetry of the asymmetric signal should be corrected.

FIG. 1a depicts a graph 100 of an asymmetric signal 102 and ideal signal 104. Ideal signal 104 includes pulses in a period that have absolute peak amplitudes that are equal and asymmetric signal 102 has pulses that have unequal absolute peak amplitudes in the period. The correction of asymmetric signal 102 is performed to correct the asymmetry of asymmetric signal to be similar to the symmetry of ideal signal 104.

One way of correcting asymmetric signal 102 is to generate a square term that increases or decreases the amplitude of asymmetric signal 102. FIG. 1b depicts a graph showing the correction. A square term 106 is combined with asymmetric signal 102 to produce an output signal 108. However, an additional path and extra circuitry are needed to generate the square term.

FIG. 2 depicts a conventional asymmetry correction circuit 200. The gain of an amplifier 202 is set by a resistance ratio for transistor M2 and transistor M1 (M2/M1). That is, the resistance of transistor M2 divided by the resistance of transistor M1 defines the gain. A gate voltage Vgate is tuned to determine the desired resistance for transistor M1 and transistor M2. For example, the resistance of transistors M1 and M2 may be varied based on the gate voltage applied to the transistors. Also, a gate voltage Vmrg is varied separately for transistors MR1 and MR2 to provide different magneto-resistive (MR) asymmetry.

The resistance of transistor M1 may vary based on a drain-source voltage across transistor M1. To limit the variation, gate voltage Vgate needs to be high enough to put transistor M1 into saturation or overdrive. Because the input voltage swing (i.e., the swing between voltages INP and INM) may be large, distortion may occur. To lower the distortion, voltage Vgate may need to be higher than a supply voltage to achieve low distortion. A charge pump may be needed to generate this voltage, which introduces additional circuitry. One way to lower the distortion is to separate transistor M1 into multiple transistors (such as two transistors in series). However, this increases the size of the transistor and introduces parasitic capacitance at a junction M located at the input of amplifier 202. This limits the bandwidth of amplifier 202 because the capacitance is at the second pole. Also, because the input impedance of transistor M1 varies with the input signal swing, if a source follower is driving transistor M1, the output resistance of the source follower needs to be the dominant factor requiring more current than is needed to be used at that stage.

SUMMARY

In one embodiment, an apparatus an amplifier configured to receive an asymmetric signal. A first resistance is coupled between an input node and an output node of the amplifier, the input node receiving the asymmetric signal. A second resistance is coupled to the input node of the amplifier. The second resistance includes a linear resistor. A third resistance is coupled to the second resistance. The third resistance is varied to adjust an amount of asymmetric correction provided by the amplifier to correct the asymmetric signal at the output node. The amount of asymmetric correction is a function of the first resistance and a combination of the second resistance and the third resistance.

In one embodiment, the first resistance includes a transistor.

In one embodiment, the linear resistor is manufactured in polysilicon.

In one embodiment, a first switch is configured to be controlled during a first interval to couple the second resistance to the third resistance to increase a gain of the amplifier to correct the asymmetric signal. The third resistance is a positive resistance. A second switch is configured to be controlled during a second interval to couple the second resistance to the third resistance to decrease the gain of the amplifier to correct the asymmetric signal. The third resistance is a negative resistance.

In one embodiment, the third resistance includes a resistor divider network configured to vary the third resistance.

In one embodiment, the asymmetric signal includes a positive asymmetric signal and a negative asymmetric signal. The third resistance includes: a first resistor and a second resistor coupled to the negative asymmetric signal; a third resistor and a fourth resistor coupled to the positive asymmetric signal; and a transistor coupled in between the first resistor and the second resistor and coupled in between the third resistor and the fourth resistor.

In another embodiment, a method includes coupling a first resistance between an input node and an output node of the amplifier; coupling a second resistance to the input node of the amplifier, the second resistance including a linear resistor; coupling a third resistance to the second resistance; receiving an asymmetric signal at the input node; and varying the third resistance to adjust an amount of asymmetric correction provided by the amplifier to correct the asymmetric signal at the output node, wherein the amount of asymmetric correction is a function of the first resistance and a combination of the second resistance and the third resistance.

The following detailed description and accompanying drawings provide a more detailed understanding of the nature and advantages of the present invention.

DETAILED DESCRIPTION

Described herein are techniques for asymmetric correction. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1A:
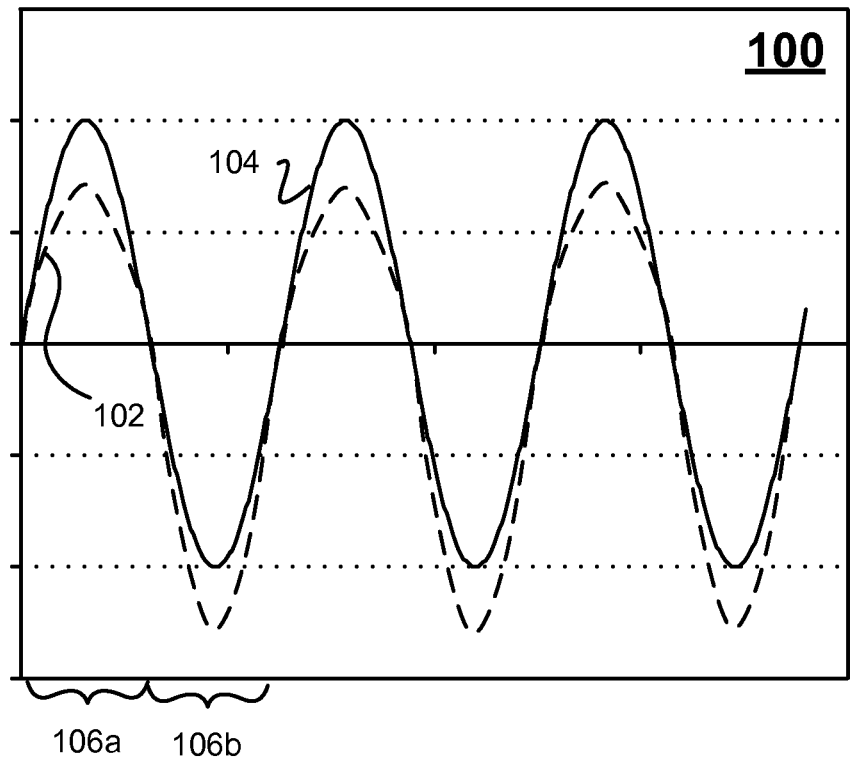
FIG. 1a depicts a graph of an asymmetric signal and ideal signal.
Figure 1B:
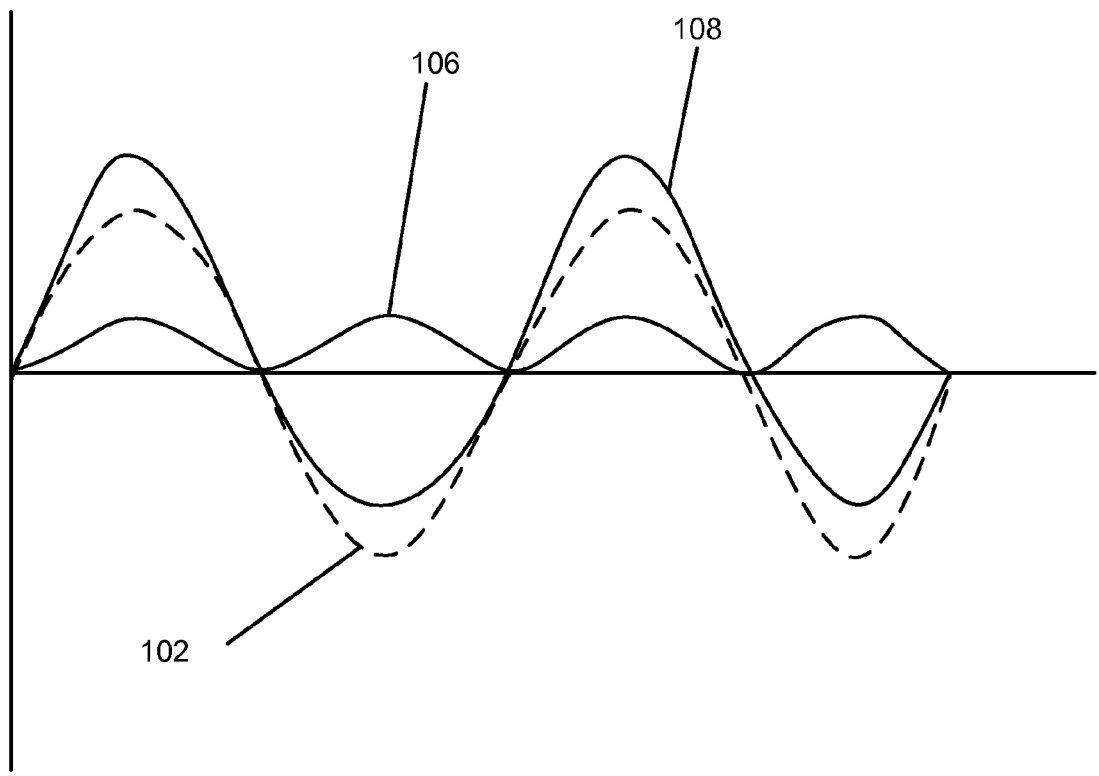
FIG. 1b depicts a graph showing asymmetric correction.
Figure 2:
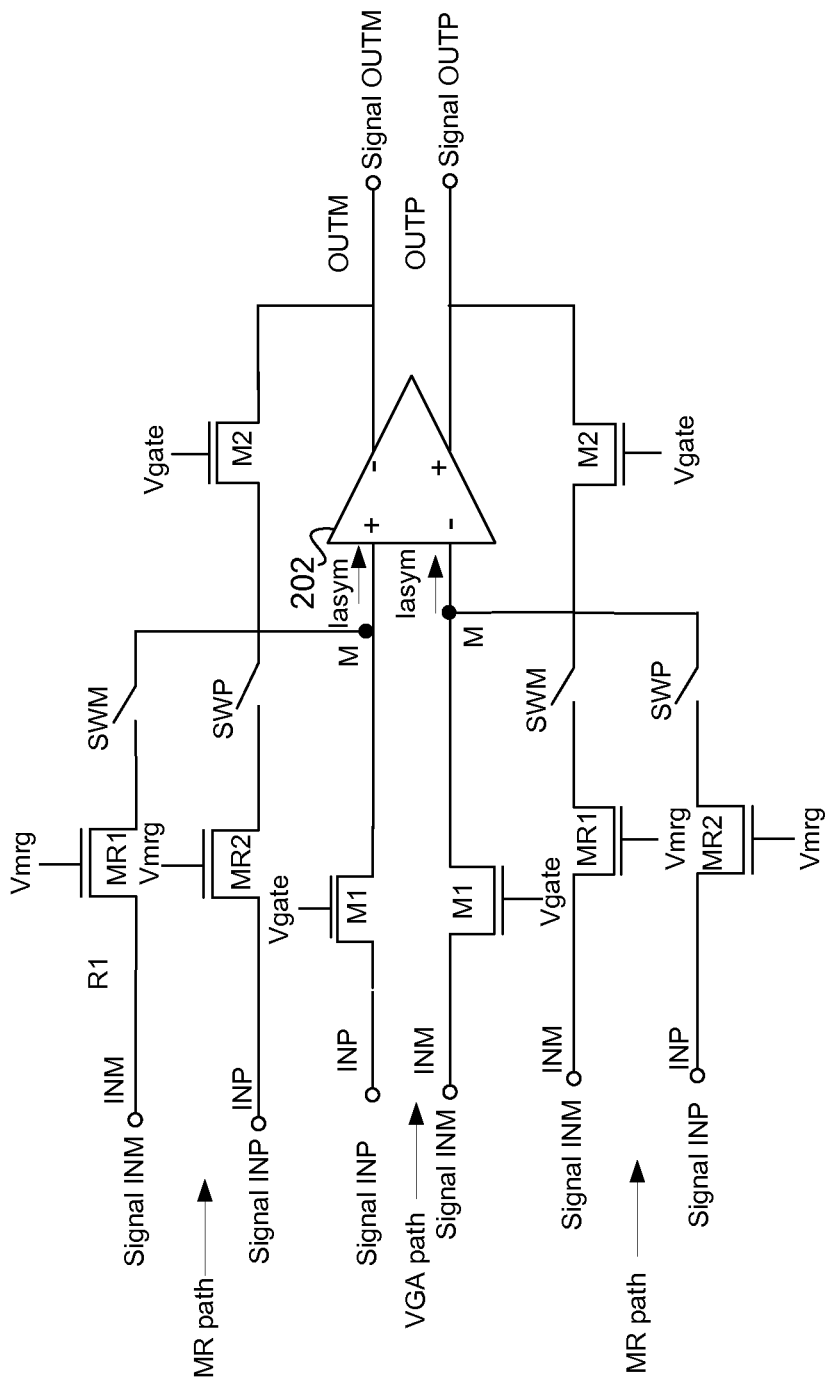
FIG. 2 depicts a conventional asymmetry correction circuit.
Figure 3:
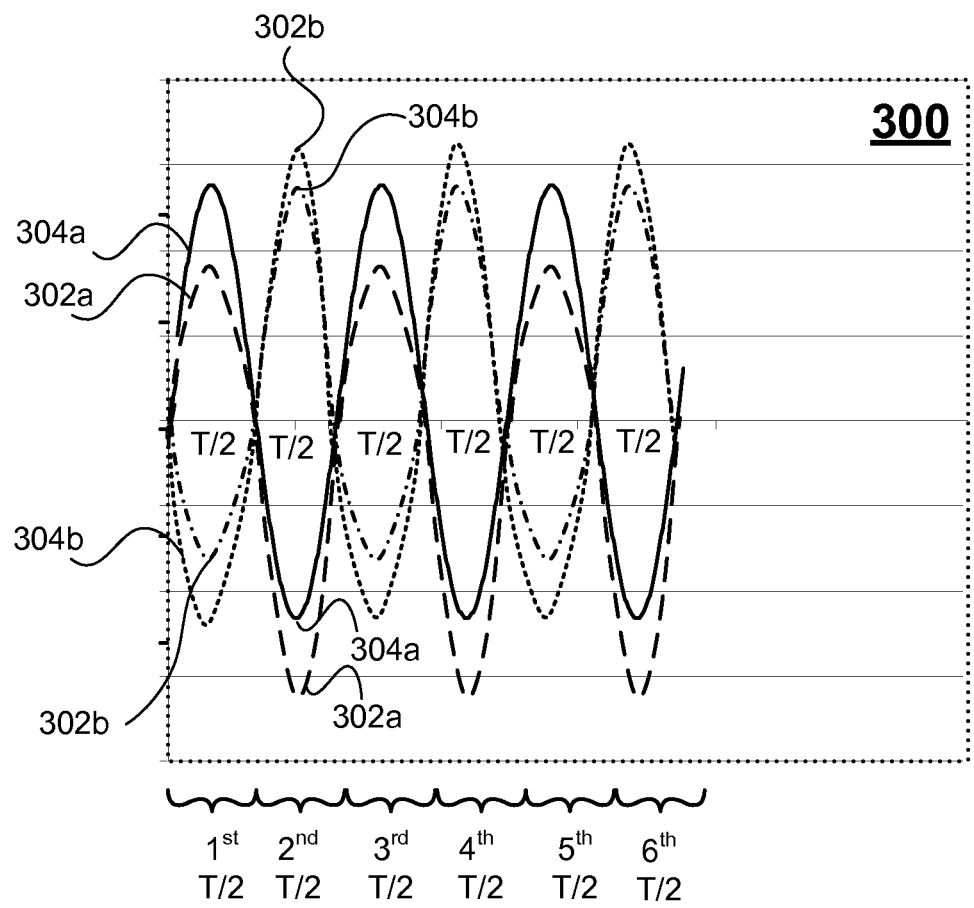
FIG. 3 shows an example of a graph showing a differential asymmetric signal according to one embodiment.

FIG. 3 shows an example of a graph 300 showing a differential asymmetric signal according to one embodiment. A positive asymmetric signal 302a and a negative asymmetric signal 302b form the differential asymmetric signal. Also, a positive ideal signal 304a and a negative ideal signal 304b are shown. To correct asymmetric signals 302a and 302b, the gain is boosted in the signal path for asymmetric signals 302a and 302b in odd half periods, e.g., a first T/2, a third T/2, a fifth T/2, and so on. This increases the amplitude of the asymmetric signal to be closer to the amplitude of ideal signals 304a and 304b, respectively. For example, as shown in the first T/2, the amplitude of asymmetric signal 302a is below that of ideal signal 304a and increasing the amplitude of asymmetric signal 302a corrects the symmetry of asymmetric signal. Also, asymmetric signal 302b may have the gain increased in the negative direction.

Also, the amplitude of asymmetric signal 302a and 302b is above the peak amplitude of ideal signal 304a in the even half periods. If the signal path gain is reduced for the even half periods, e.g., a second T/2, a fourth T/2, a sixth T/2, and so on, then asymmetric signals 302a and 302b have their amplitude reduced to be closer to the amplitude of ideal signals 304a and 304b.

Figure 4:
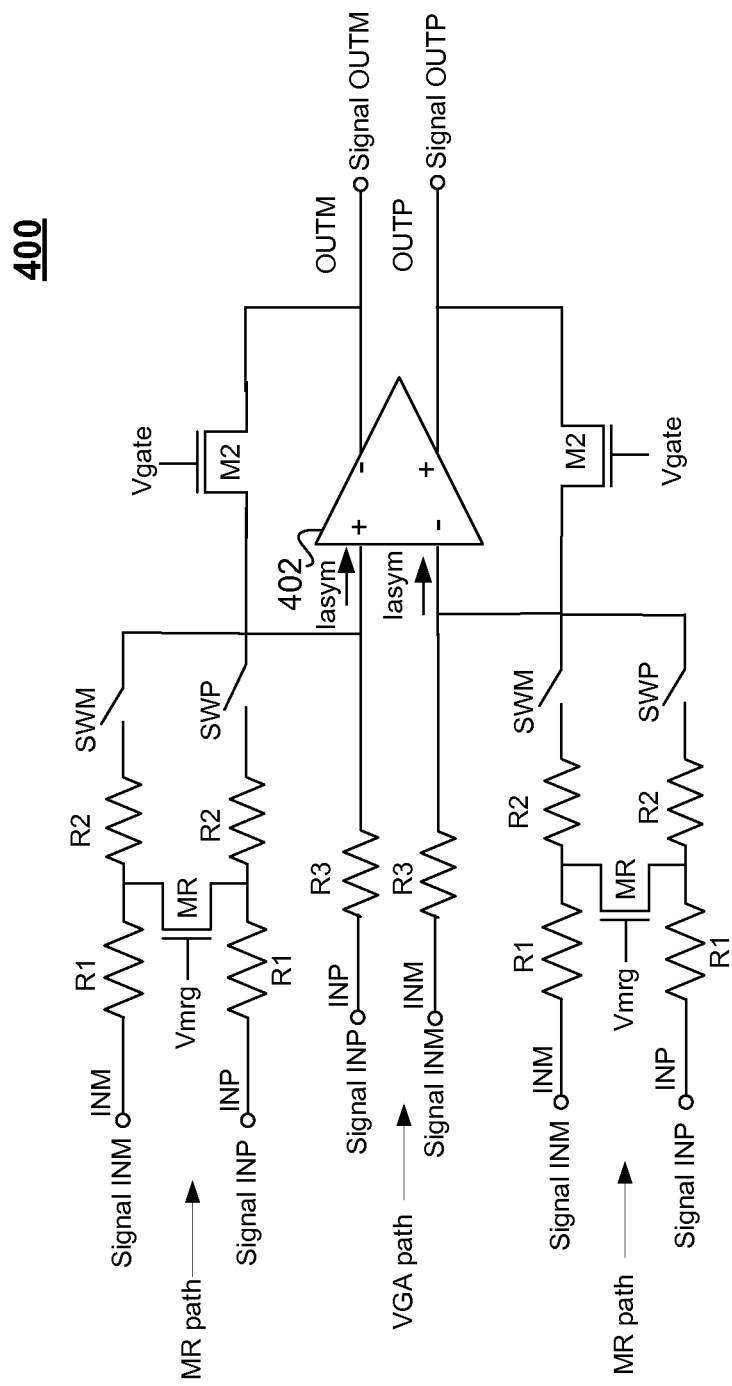
FIG. 4 depicts a system for correcting an asymmetric signal according to one embodiment.

FIG. 4 depicts an asymmetry correction circuit 400 according to one embodiment. Circuit 400 may be used in a read channel to process a signal received from a read-head of a hard disk drive (HDD). However, circuit 400 may be used in other applications where correction of an asymmetric signal is required. The asymmetric signal may be received from a pre-amplifier in the read channel. A corrected signal may then be output to an analog processor, such as an analog-to-digital converter (ADC).

The asymmetric signal may be received at a variable gain amplifier (VGA) 402. In one embodiment, the asymmetric signal may be a differential asymmetric signal including a signal INP and a signal INM. When used in this disclosure, the asymmetric signal may refer to a differential version or a single-ended version.

A linear resistor R3 is used to lower distortion in asymmetry correction circuit 400. A linear resistor may be manufactured in polysilicon. For example, a gate of a transistor is not controlled to determine the resistance of linear resistor R3. Also, the resistance of resistor R3 does not vary greatly when the voltage across its terminals changes in contrast to characteristics of a transistor. For example, when a gate voltage is varied in a transistor, the resistance of the transistor varies.

Amplifier 402 corrects an asymmetric signal input received at input nodes INP and INM to output the corrected signal at output nodes OUTM and OUTP. The asymmetric signal is corrected by increasing or decreasing the gain of amplifier 402. As will be described in more detail below, the gain of amplifier 402 may be decreased by adding a negative resistance to the input resistance. Also, the gain of amplifier 402 may be increased by adding a positive resistance to the input resistance.

An amount of current Iasym is used to vary the asymmetry correction. For example, when a gate voltage Vmrg of a transistor MR is high, transistor MR turns on and current is conducted away from the input of amplifier 402 thereby decreasing gain. When the gate voltage Vmrg is low, then transistor MR is off and the amount of current flowing into the input of amplifier 402 is increased thereby increasing gain. The amount of asymmetry correction may be varied based on the gate voltage Vmrg of transistor MR. For example, 2% asymmetry may be corrected when voltage Vmrg is high, which turns on transistor MR. A 30% asymmetry correction may be performed when Vmrg is low, which turns off transistor MR.

To determine the asymmetry correction, voltage Vinp−voltage Vinm is a maximum delta input swing. Vinp is a voltage at node INP and voltage Vinm is a voltage at a node INM. The asymmetry current Iasym may be defined by the current input into a terminal of amplifier 402 and is equal to:

$$Iasym=(Vinp-Vinm)/2*Rmrg/(Rmrg*R1+R2*R2+R2*Rmrg),$$

where Rmrg is the resistance of transistor MR. The asymmetry percentage may be defined by:

$$Asym\%=Iasym/(Vinp-Vinm)/R3.$$

Switches SWP and SWM may be opened and closed such that at one interval both of switches SWP are closed and both of switches SWM are open. During a second interval, both of switches SWP are open and both of switches SWM are closed.

For signal INP, the amount of current Iasym is controlled by how much resistance is added in parallel to resistor R3. For example, the amount of resistance in the MR path is based on resistor R1, R2, and a resistance Rmrg of transistor MR. Resistors R1 and R2 may also be linear resistors. However, in other embodiments, resistors R1 and R2 may be nonlinear resistors. The resistance in the MR path may be positive or negative. For example, when switch SWP is on, a negative resistance is added in parallel to resistor R3. When switch SWM is on, a positive resistance is added in parallel to resistor R3. Particular embodiments vary the input resistance seen at the terminals of amplifier 402 by adding the positive resistance or the negative resistance to resistor R3.

In one embodiment, the feedback resistance is not varied by adding resistors in parallel to transistor M2. This may simplify the control of which resistors are added in parallel. For example, control is needed to either add the positive resistance or negative resistance in parallel to resistor R3. However, no control is needed to add any resistors in parallel to transistor M2 in conjunction with adding the positive resistance or negative resistance in parallel to resistor R3.

As discussed above, the signal path gain may be increased for the odd half periods. For the odd half periods, switches SWP may be closed. When switches SWP are closed, a positive resistance is added in parallel to resistor R3 to reduce the input resistance. The gain may be the resistance of transistor M2 (RM2) divided by the input resistance (Rin) (gain=RM2/Rin). Due to the ratio of the gain, a smaller input resistance increases the signal gain accordingly.

When signal gain needs to be decreased during the even half periods, switches SWM are closed. In this case, a negative resistance is added in parallel to resistor R3. The negative resistance appears as a negative resistance to an input of amplifier 402. In one embodiment, the negative resistance is the same resistance value as the positive resistance, but appears as a negative resistance to the input of amplifier 402. Adding the negative resistance increases the input resistance, which reduces the signal gain accordingly.

Accordingly, the process of increasing gain for a half period and then decreasing gain for a next half period may continue for successive half periods to correct signal asymmetry. The above also applies for the path input into the negative terminal of amplifier 402. For example, when switch SWP is closed, the input resistance is reduced to increase the gain. When switch SWM is closed, the input resistance is increased to reduce the signal gain. The increase in gain the first half period and decrease in gain in the next half period corrects the asymmetry of signal INM.

The distortion in circuit 400 mainly depends on feedback transistor M2 due to resistor R3 being a linear resistor (and also due to resistors R1 and R2 being linear resistors in some cases). This eliminates a contribution of distortion from the input resistance. Also, the resistance is fixed for resistor R3 and a source follower is not needed that would use extra current to lower the distortion than if a transistor is used at the input. Also, no junction capacitance is associated with the linear resistors, which results in less parasitic capacitance at the input.

Figure 5:
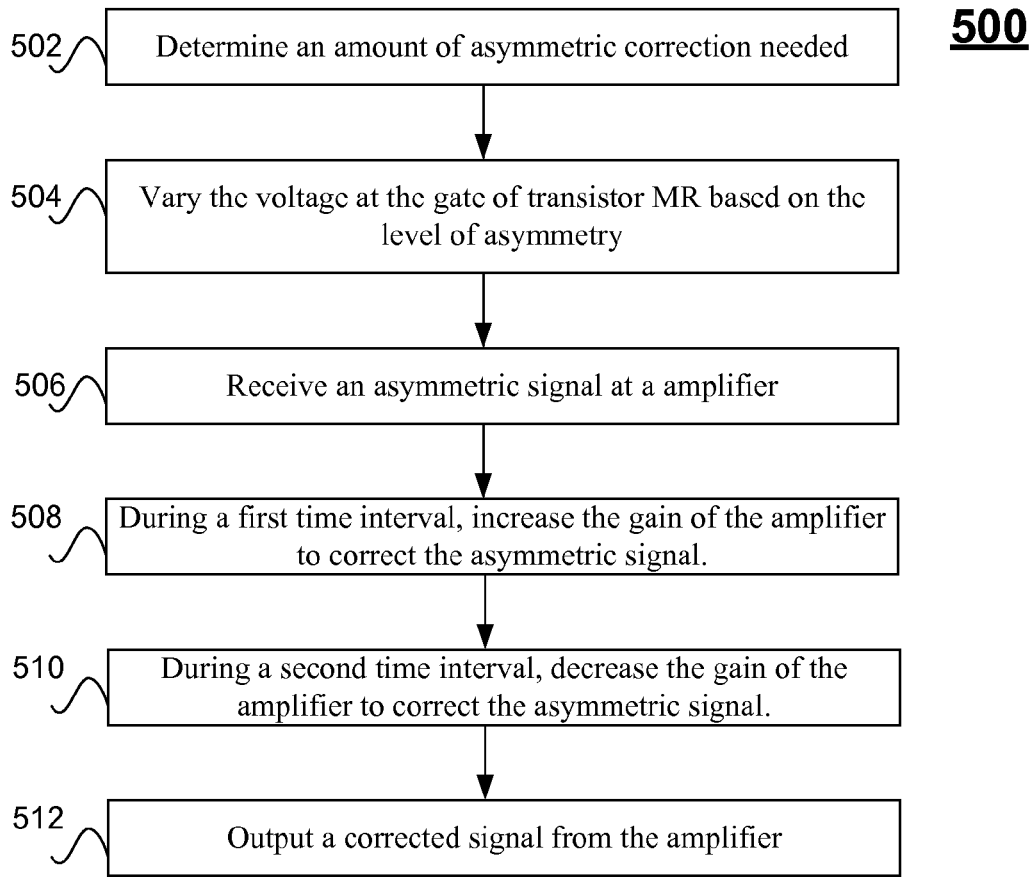
FIG. 5 depicts a simplified flowchart of a method for performing asymmetric correction according to one embodiment.

FIG. 5 depicts a simplified flowchart 500 of a method for performing asymmetric correction according to one embodiment. At 502, an amount of asymmetric correction needed is determined. For example, a feedback circuit is used to determine the amount of asymmetry correction needed. At 504, the voltage at the gate of transistor MR is varied based on the amount of asymmetry correction needed. For example, the voltage may be varied to increase or decrease the asymmetry correction.

At 506, an asymmetric signal is received at amplifier 402. At 508, during a first time interval, the gain of amplifier 402 is increased to correct the asymmetric signal. For example, a positive resistance is coupled in parallel with resistor R3. This decreases the input resistance and increases the gain.

At 510, during a second time interval, the gain of amplifier 402 is decreased to correct the asymmetric signal. For example, a negative resistance is coupled in parallel to resistor R3. This increases the input resistance and decreases the gain. At 512, a corrected signal is output by amplifier 402.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
   an amplifier having an input node and an output node, wherein the amplifier is configured to receive an asymmetric signal;
   a first resistance connected between (i) the input node of the amplifier and (ii) the output node of the amplifier, wherein the input node of the amplifier is configured to receive the asymmetric signal;
   a second resistance connected to the input node of the amplifier, wherein the second resistance comprises a linear resistor; and
   a third resistance connected to the second resistance, wherein a resistance of the third resistance is adjustable to (i) adjust an amount of asymmetric correction provided by the amplifier, and (ii) correct, based on the amount of asymmetric correction, the asymmetric signal at the output node of the amplifier, and wherein the amount of asymmetric correction is a function of (i) the first resistance, and (ii) a combination of the second resistance and the third resistance,
   wherein the third resistance comprises (i) a fourth resistance configured to receive a first input voltage, and (ii) a fifth resistance configured to receive a second input voltage.

2. The apparatus of claim 1, wherein the first resistance comprises a transistor.

3. The apparatus of claim 1, wherein the linear resistor comprises polysilicon.

4. An apparatus comprising:
   an amplifier having an input node and an output node, wherein the amplifier is configured to receive an asymmetric signal;
   a first resistance connected between (i) the input node of the amplifier and (ii) the output node of the amplifier, wherein the input node of the amplifier is configured to receive the asymmetric signal;
   a second resistance connected to the input node of the amplifier, wherein the second resistance comprises a linear resistor;
   a third resistance connected to the second resistance, wherein a resistance of the third resistance is adjustable to (i) adjust an amount of asymmetric correction provided by the amplifier, and (ii) correct, based on the amount of asymmetric correction, the asymmetric signal at the output node, and wherein the amount of asymmetric correction is a function of (i) the first resistance, and (ii) a combination of the second resistance and the third resistance;
   a first switch configured to be controlled to, during a first interval, connect the second resistance to the third resistance to (i) increase a gain of the amplifier, and (ii) correct the asymmetric signal, wherein the resistance of the third resistance is positive during the first interval; and
   a second switch configured to be controlled to, during a second interval, connect the second resistance to the third resistance to (i) decrease the gain of the amplifier, and (ii) correct the asymmetric signal, wherein the resistance of the third resistance is negative during the second interval.

5. The apparatus of claim 1, wherein:
   the third resistance comprises a resistor divider network; and
   the resistor divider network is configured to vary the resistance of the third resistance.

6. An apparatus comprising:
   an amplifier having an input node and an output node, wherein the amplifier is configured to receive an asymmetric signal;
   a first resistance connected between (i) the input node of the amplifier and (ii) an output node of the amplifier, wherein the input node of the amplifier is configured to receive the asymmetric signal;

a second resistance connected to the input node of the amplifier, wherein the second resistance comprises a linear resistor; and a third resistance connected to the second resistance, wherein a resistance of the third resistance is adjustable to (i) adjust an amount of asymmetric correction provided by the amplifier, and (ii) correct, based on the amount of asymmetric correction, the asymmetric signal at the output node, and wherein the amount of asymmetric correction is a function of (i) the first resistance, and (ii) a combination of the second resistance and the third resistance, wherein the asymmetric signal comprises a positive asymmetric signal and a negative asymmetric signal, and wherein the third resistance comprises a first resistor and a second resistor, wherein at least one of the first resistor or the second resistor is configured to receive the negative asymmetric signal, a third resistor and a fourth resistor, wherein at least one of the third resistor or the fourth resistor is configured to receive the positive asymmetric signal, and a transistor connected (i) between the first resistor and the second resistor, and (ii) between the third resistor and the fourth resistor.

7. The apparatus of claim 6, wherein:

while the transistor is on, the second resistance, the first resistor, the second resistor, and the third resistor are connected in parallel; and while the transistor is off, (i) the second resistance, the first resistor, and the second resistor are connected in parallel, or (ii) the second resistance, the third resistor, and the fourth resistor are connected in parallel.

8. The apparatus of claim 6, wherein the resistance of the third resistance is based on a voltage at a gate of the transistor.

9. The apparatus of claim 8, wherein:

while the voltage at the gate of the transistor decreases, the amount of asymmetric correction provided by the amplifier increases; and while the voltage at the gate of the transistor increases, the amount of asymmetric correction provided by the amplifier decreases.

10. The apparatus of claim 9, wherein:

while the voltage at the gate of the transistor decreases, a current supplied to the amplifier decreases; and while the voltage at the gate of the transistor decreases, the current supplied to the amplifier decreases.

11. A method for applying asymmetric correction to an asymmetric signal received at an amplifier, wherein the amplifier comprises (i) an input node, and (ii) an output node, wherein a first resistance is connected between (i) the input node of the amplifier and (ii) the output node of the amplifier, wherein a second resistance is connected to the input node of the amplifier, and wherein a third resistance is connected to the second resistance, the method comprising:

receiving a negative voltage by the third resistance;

receiving the asymmetric signal at the input node of the amplifier based on the negative voltage; and adjusting a resistance of the third resistance to (i) adjust an amount of asymmetric correction provided by the amplifier, and (ii) correct, based on the amount of asymmetric correction, the asymmetric signal at the output node of the amplifier, wherein the amount of asymmetric correction is a function of (i) the first resistance, and (ii) a combination of the second resistance and the third resistance.

12. The method of claim 11, wherein the first resistance comprises a transistor.

13. The method of claim 11, wherein the second resistance comprises polysilicon.

14. The method of claim 11, further comprising:

during a first interval, controlling a first switch to couple the second resistance to the third resistance to (i) increase a gain of the amplifier, and (ii) correct the asymmetric signal, wherein the resistance of the third resistance is positive during the first interval; and during a second interval, controlling a second switch to couple the second resistance to the third resistance to (i) decrease the gain of the amplifier, and correct the asymmetric signal, wherein resistance of the third resistance is negative during the second interval.

15. The method of claim 11, further comprising adjusting the resistance of the third resistance via a resistor divider network, wherein the third resistance comprises the resistor divider network.

16. The method of claim 11, further comprising:

receiving a negative asymmetric signal by at least one of a first resistor or a second resistor, wherein the third resistance comprises the first resistor and the second resistor;

receiving a positive asymmetric signal by at least one of a third resistor and a fourth resistor, wherein the third resistance comprises the third resistor and the fourth resistor; and adjusting a state of a transistor, wherein the transistor is connected (i) between the first resistor and the second resistor, and (ii) between the third resistor and the fourth resistor.

17. The method of claim 16, further comprising:

transitioning the transistor to an ON state, wherein, while the transistor is in the ON state, the second resistance, the first resistor, the second resistor, and the third resistor are connected in parallel; and transitioning the transistor to an OFF state, wherein, while the transistor is in the OFF state, (i) the second resistance, the first resistor, and the second resistor are connected in parallel, or (ii) the second resistance, the third resistor, and the fourth resistor are connected in parallel.

18. The method of claim 16, adjusting a voltage at a gate of the transistor to adjust the resistance of the third resistance.

19. The method of claim 18, further comprising:

decreasing the voltage at the gate of the transistor while increasing the amount of asymmetric correction provided by the amplifier; and increasing the voltage at the gate of the transistor while decreasing the amount of asymmetric correction provided by the amplifier.

20. The method of claim 18, further comprising:

decreasing the voltage at the gate of the transistor while increasing a current input into the amplifier; and decreasing the voltage at the gate of the transistor while decreasing the current input into the amplifier.

21. The apparatus of claim 1, wherein the second resistance is connected in parallel with the third resistance.

22. The apparatus of claim 1, wherein:

the first input voltage is a positive voltage, and the second input voltage is a negative voltage.

23. The apparatus of claim 1, wherein:

the third resistance comprises a first switch having a first state and a second state;

the first switch is configured to, while in the first state, connect the fourth resistance to the fifth resistance; and the first switch does not connect the fourth resistance to the fifth resistance while the first switch is in the second state.

24. The apparatus of claim 23, wherein the third resistance comprises:
   a second switch configured to connect the fourth resistance to the input node of the amplifier; and
   a third switch configured to connect the fifth resistance to the input node of the amplifier.

25. The method of claim 11, further comprising receiving a positive voltage by the third resistance.

26. The method of claim 25, further comprising:
   receiving the negative voltage by a fourth resistance; and
   receiving the positive voltage by a fifth resistance, wherein the third resistance comprises the fourth resistance and the fifth resistance.

\* \* \* \* \*